United States Patent [19]
Stengel et al.

[11] Patent Number: 5,892,395
[45] Date of Patent: Apr. 6, 1999

[54] METHOD AND APPARATUS FOR EFFICIENT SIGNAL POWER AMPLIFICATION

[75] Inventors: Robert E. Stengel, Pompano Beach; Scott A. Olson, Davie, both of Fla.

[73] Assignee: Motorola, Inc., Schaumburg, Ill.

[21] Appl. No.: 850,541

[22] Filed: May 2, 1997

[51] Int. Cl.[6] ............................................. H03F 3/68
[52] U.S. Cl. ............................... 330/124 R; 333/123
[58] Field of Search ............................. 330/124 R, 295, 330/129; 455/103, 107, 127, 129; 315/169.3; 333/117, 120, 123

[56] References Cited

U.S. PATENT DOCUMENTS

| | | | |
|---|---|---|---|
| 4,701,716 | 10/1987 | Poole | 330/124 R |
| 5,222,246 | 6/1993 | Wolkstein | 455/126 |
| 5,287,069 | 2/1994 | Okubo et al. | 330/10 |
| 5,304,943 | 4/1994 | Koontz | 330/124 R |
| 5,428,314 | 6/1995 | Swafford et al. | 330/149 |
| 5,559,402 | 9/1996 | Corrigan, III | 315/169.3 |

OTHER PUBLICATIONS

Cox, D.C., "Linear Amplification with Nonlinear Components," Institute of Electrical and Electronics Engineers Transactions on Communications, Dec. 1974, pp. 1942–1945.

Hetzel, S.A., A. Bateman and J.P. McGeehan, "A LINC Transmitter," Institute of Electrical and Electronics Engineers, Inc., 1991, pp. 133–137.

Chan, Kam–yuen and Andrew Bateman, "Linear Modulators Based on RF Synthesis: Realization and Analysis," Institute of Electrical and Electronics Engineers, Inc., 1995, pp. 321–333.

*Primary Examiner*—Robert Pascal
*Assistant Examiner*—Khanh V. Nguyen
*Attorney, Agent, or Firm*—Andrew S. Fuller

[57] ABSTRACT

An apparatus (100) uses power recovery from a combining circuit (125) to improve efficiency. A power combiner (125) generates multiple output signals (127, 133) from a combination of input signals (113, 114). One of the output signals from the power combiner is coupled to a power recovery circuit (135), and energy is recovered and preferably stored for later use.

16 Claims, 4 Drawing Sheets

METHOD AND APPARATUS FOR EFFICIENT SIGNAL POWER AMPLIFICATION

TECHNICAL FIELD

This invention relates in general to radio frequency (RF) amplifiers, and more particularly to power combining for signals from multiple signal paths.

BACKGROUND

Analog signaling techniques, such as frequency modulation (FM), have traditionally permitted radio designers to use very efficient non-linear power amplifiers to transmit radio frequency (RF) power signals. Digital modulation, however, often requires linear power amplification, since digital information is often represented in the amplitude and phase of the transmitted signal. In general, linear amplifiers have not been as efficient as certain non-linear amplifiers, since a linear amplifier remains active, and dissipates power, throughout the entire cycle of the amplified signal. In contrast, non-linear amplifiers, such as class C, D, E, F, G, and S amplifiers, dissipate power for less than half of a cycle of the amplified signal. With the growing popularity of digital modulation for various applications, especially those of mobile and portable electronic radio products, there is a need to obtain the power efficiency typically associated with non-linear power amplification, for linear amplification. The prior art discloses methods used to improve the efficiency of linear amplifiers. These methods generally involve load or supply modulation in order to obtain increased efficiency. However, such methods tend to require complex implementation. It is desirable to provide for efficient signal power amplification without substantial complexity.

DETAILED DESCRIPTION OF THE PREFERRED EMBODIMENT

The present invention provides for energy recovery when combining multiple signals, such as when combining signals from multiple amplification paths. A power combiner generates multiple output signals from a combination of input signals. One of the output signals from the power combiner is coupled to a power recovery circuit, and the energy is recovered and preferably stored for later use.

Figure 1:
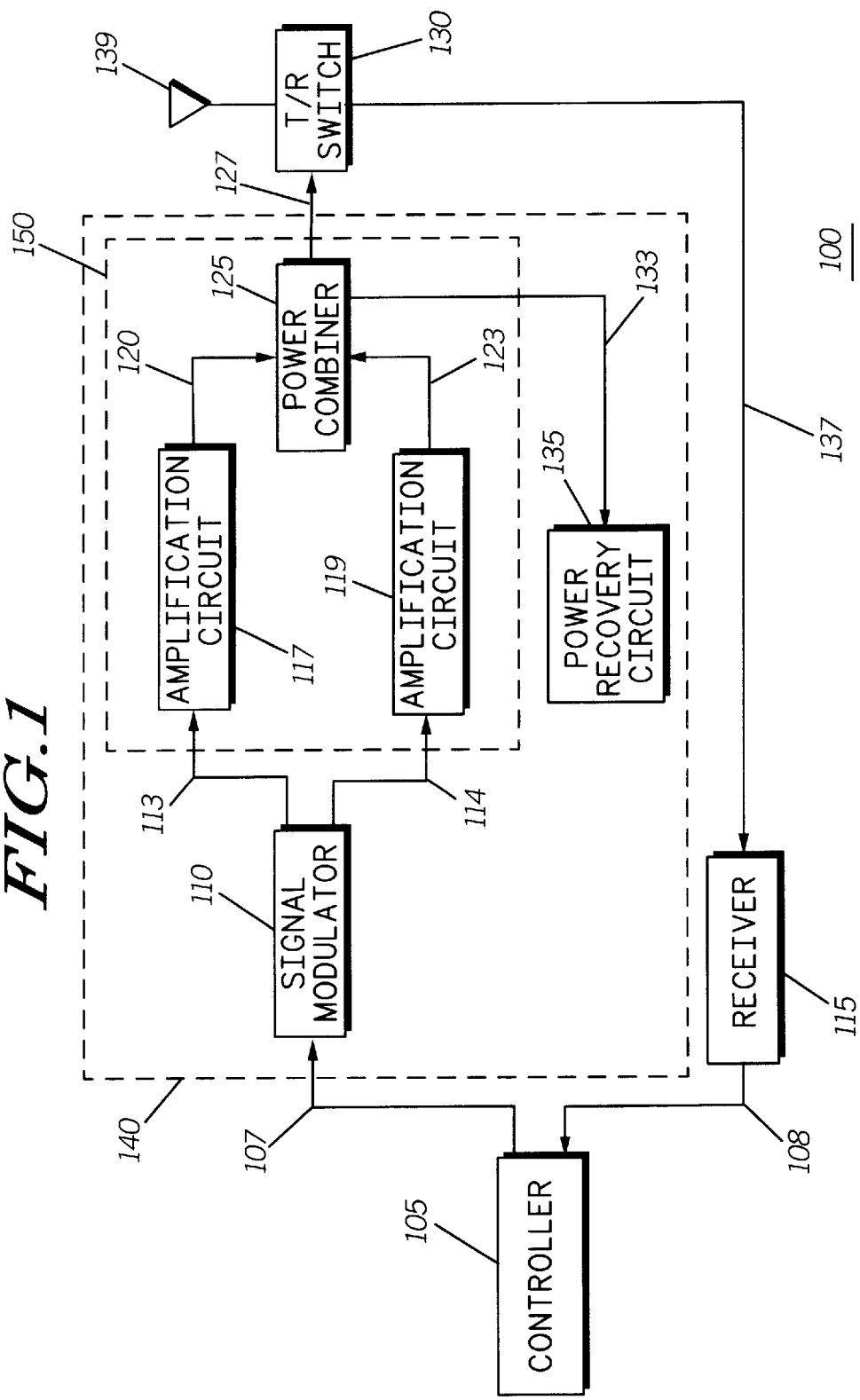
FIG. 1 is a block diagram of a radio, in accordance with the present invention.

FIG. 1 is a simplified block diagram depicting a radio 100, in accordance with the present invention. The radio 100 includes a controller 105, which provides operational control of the radio. The radio 100 also includes a transmitter 140, and a receiver 115, which are coupled to an antenna 139 through a transmit/receive (T/R) switch 130. The radio is operable in a receive mode in which an RF receive signal 137 is directed from the antenna 139 to the receiver 115. The receiver 115 provides a receive baseband signal 108, which is derived from the RF receive signal 137, to the controller 105.

The radio is also operable in a transmit mode in which the controller 105 operates the transmitter 140 to process a baseband signal 107. The transmitter 140 includes a signal modulator 110, and a linear amplifier 150. Preferably, the linear amplifier 150 is of the linear amplifier with non-linear components (LINC) type. The signal modulator 110, receives the transmit baseband signal 107 from the controller 105, and produces RF modulated signals 113, 114. The linear amplifier 150 includes the amplification paths or circuits 117, 119 which amplify the RF modulated signals 113, 114, and provide input signals 120, 123 to a power combiner 125. In one embodiment, the amplification circuits 117, 119 are operated in class C amplification mode. For LINC amplification, the RF modulated signals 113, 114 are designed to have equal and constant amplitude, and are modulated by the signal modulator 110 such that a particular and varying phase relationship exists between the RF modulated signals 113, 114. The power combiner 125 is coupled to receive the input signals 120, 123 and combines them to form an output signal 127. In one embodiment, the output signal 127 is an amplitude modulated RF signal, in which information is represented in both the phase and the amplitude of the first output signal 127. The output signal 127 is then delivered to the T/R switch 130 to be transmitted through antenna 139. The power combiner 125 also diverts RF power that is not delivered to the transmit/receive switch 130 to a power recover circuit 135, through another output signal 133 which functions as a power recovery signal. In the preferred embodiment, the power recovery circuit 135 includes an energy storage device, such as an energy cell, that is charged from the power recovery signal and used to power the radio 100.

Figure 2:
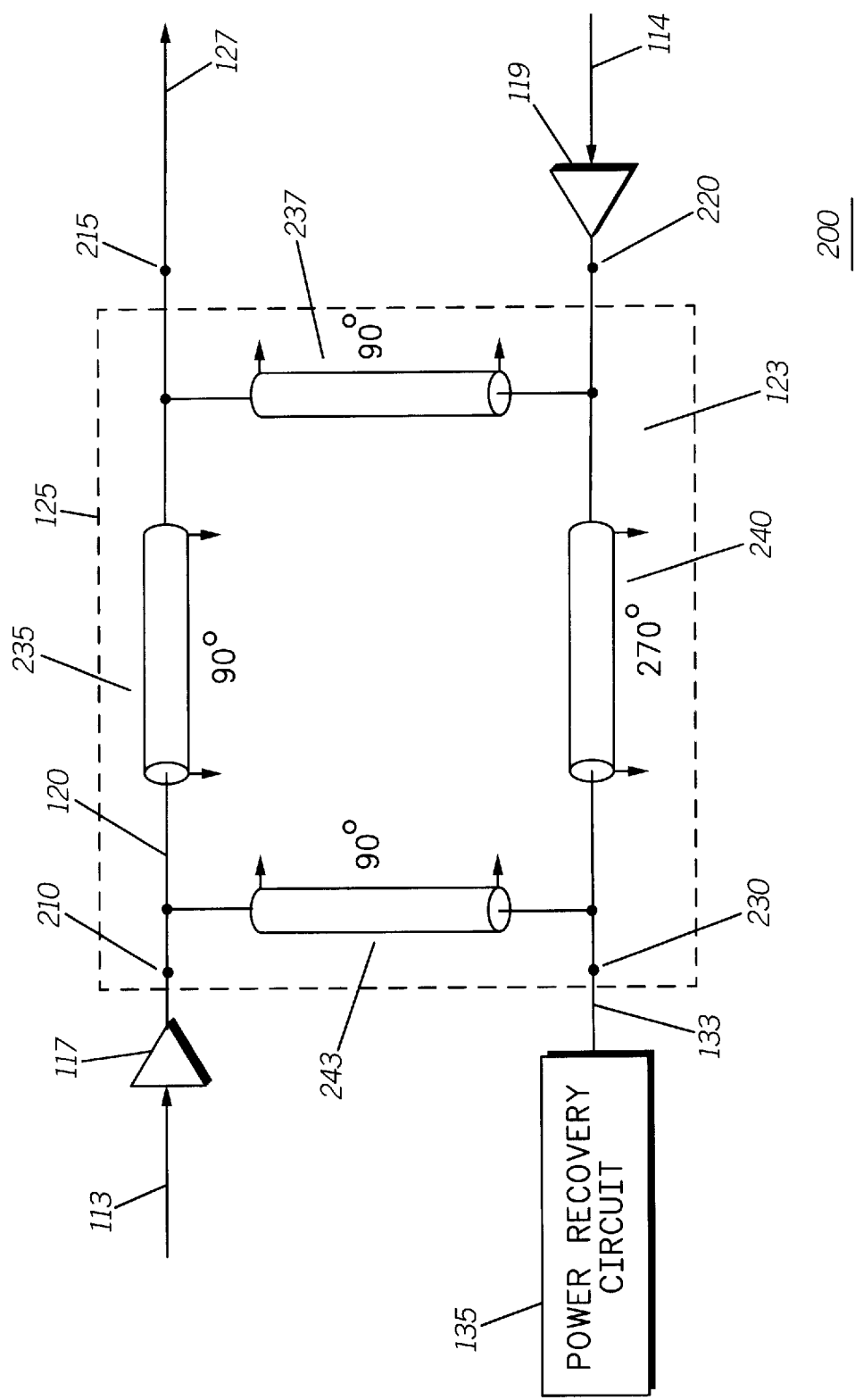
FIG. 2 is a schematic diagram detailing a power combiner, in accordance with the present invention.

FIG. 2 is a circuit diagram which illustrates one preferred embodiment of the present invention. The RF modulated signals 113, 114 are coupled to first and second amplification circuits 117, 119 respectively. The power combiner 125 includes two input ports 210, 220, and two output ports 215, 230. An output port 215 selectively conducts RF output power out of the combiner, and is coupled to a transmission element, such as an antenna. Another output port 230 selectively conducts RF power out of the power combiner 125, and is coupled to the power recovery circuit 135, as described below. The two amplification circuits 117, 119 are each coupled to direct an input signal into the combiner input ports 210, 220. In the preferred embodiment, the amplification circuits 117, 119 are non-linear amplifiers, and the input signals 120, 123, produced by the amplification circuits 117, 119, preserve the constant amplitude and particular phase relationship which is also present in the RF modulated signals 113, 114. Four impedance transformers 235, 237, 240, 243, are included in the power combiner 125 such that one impedance transformer is coupled between each input port and each output port. Each impedance transformer has a phase shift which is chosen to facilitate the power signal combining at output ports 215, 230, such that when maximum power exists at one of the two output ports, minimum power exists at the other output port. The power level which exists at either output port 215, 230 is essentially the sum and difference, respectively, of the input signals 120, 123, and is controllable by adjusting the relative phase of the RF modulated signals 113, 114. In the preferred embodiment, the impedance transformers 235, 237, 240, 243, are transmission lines, and have phase shifts of 90, 90, 270, and 90 degrees, respectively.

Figure 3:
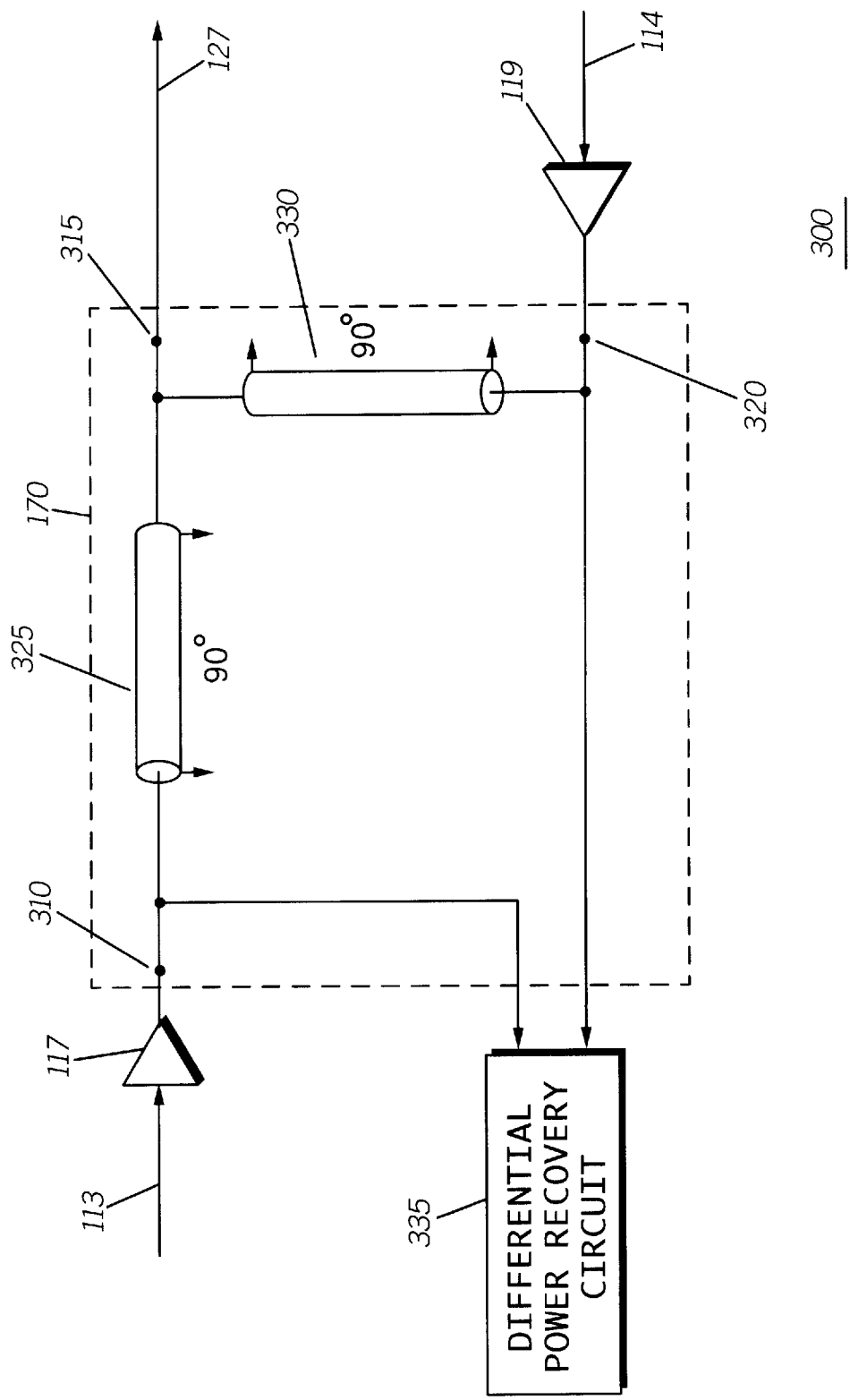
FIG. 3 is a second embodiment of the power combiner in accordance with the present invention.

FIG. 3 depicts a second embodiment of the present invention that uses a Wilkinson type combiner 170. As in FIG. 2, the RF modulated signals 113, 114 are coupled to the first and second amplification circuits 117, 119 respectively. The Wilkinson combiner 170 includes two input ports 310, 320 and one output port 315. The output port 315 selectively conducts RF output power out of the combiner 170, and is coupled to a transmission element, such as an antenna. The two amplification circuits 117, 119 are coupled to the combiner 170 to direct an amplified RF power signal into the respective input ports 310, 320. A power recovery circuit in the form of a differential RF to direct current (DC) converter 335 is also coupled to the input ports 310, 320 and is operative such that when the signals present at the input ports 310, 320 are 180 degrees out of phase, the differential RF to DC converter 335 will produce maximum DC power. When the signals present at the input ports 310, 320 are in phase, the RF/DC converter 335 will produce minimum DC power. Maximum RF power will be present at the output port 315 when the signals present at the input ports 310, 320 are in phase, while minimum power will be present at the output port 315 when the signals at the input ports 310, 320 are 180 degrees out of phase. The Wilkinson combiner 170 includes two impedance transformers 325, 330 which are configured such that one impedance transformer is coupled between one input port and one output port. Preferably, the impedance transformers 325, 330 each have the same phase shift. In one embodiment, the impedance transformers 325, 330 each have a phase shift of 90 degrees.

Figure 4:
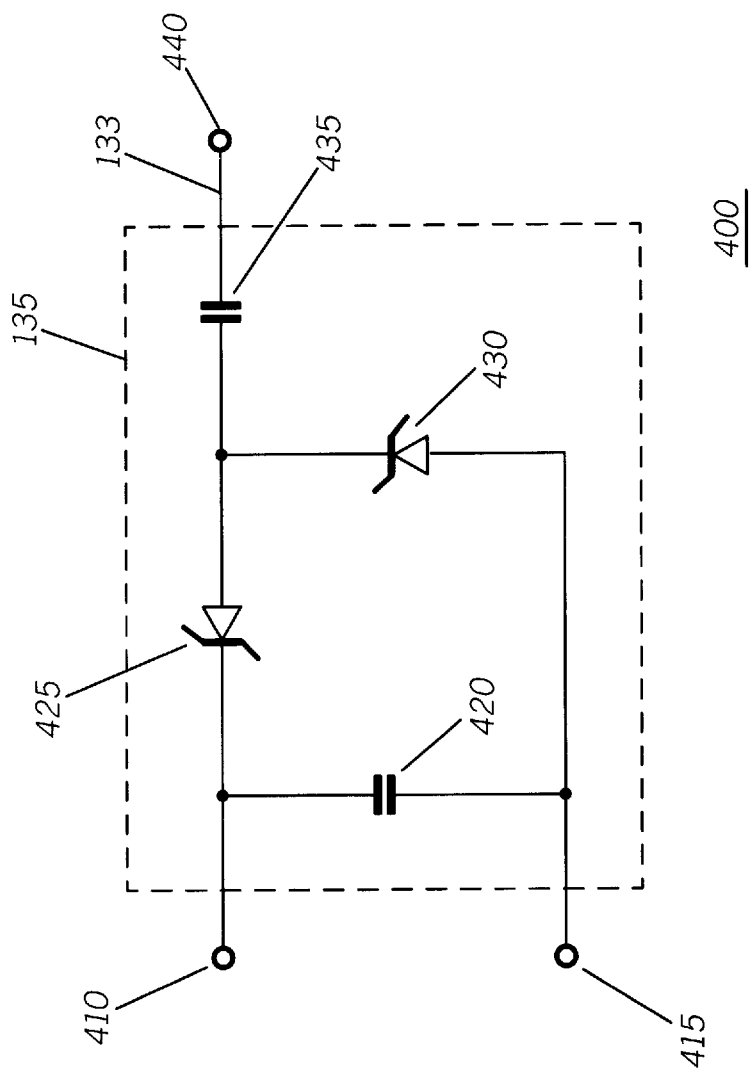
FIG. 4 is a schematic representation of the preferred embodiment of a power recovery circuit.

FIG. 4 is a schematic diagram which illustrates the preferred embodiment for the single-ended RF to DC converter 135. The single ended RF to DC converter 135 is a full wave rectifier circuit which has a single ended input port 440. The single ended RF to DC converter 135 couples a power recovery signal 133 through a series capacitor 435 to the anode of a first diode 425, and to the cathode of a second diode 430. The anode of the second diode 430 and the cathode of first diode 425 are coupled through a charging capacitor 420. DC power is stored across the charging capacitor 420 when the power recovery signal 133 is present. Preferably, the diodes 425 and 430 are schottky diodes.

The present invention offers significant improvements over the prior art. Power that is output from a combiner, but which is not directed to a useful load, is not simply dissipated, but rather stored to be used for further applications within a given product. The combining technique may be used in conjunction with non-linear amplifiers and a power recovery circuit to form a very efficient linear amplifier. Further, unlike other techniques for efficient linear amplifiers, the present invention does not include a feedback loop bandwidth restriction.

Numerous modifications, changes, variations, substitutions and equivalents will occur to those skilled in the art without departing from the spirit and scope of the present invention as defined by the appended claims.

What is claimed is:

1. An apparatus, comprising:
a power combiner responsive to first and second input signals to generate a first output signal representing a sum of the first and second input signals, and a second output signal representing a difference between the first and second input signals, wherein the second output signal is generated from the first and second input signals, and the second output signal is coupled to the power recovery circuit, the power combiner further comprising:
   first, second and third ports, the first and second ports being coupled to the first and second input signals respectively, the third port providing the first output signal;
   a first impedance transformer coupled between the first and second ports; and
   a second impedance transformer coupled between the second and third ports;
   wherein each impedance transformer has a substantially equal phase shift;
a power recovery circuit coupled to one of the first and second output signals;
an amplification circuit coupled to the power combiner, the amplification circuit having first and second amplification paths that provide the first and second input signals, respectively, wherein the first and second amplification paths comprise substantially non-linear amplifiers;
wherein the second output signal is generated from the first and second input signals, and the second output signal is coupled to the power recovery circuit.

2. An apparatus, comprising:
a power combiner responsive to first and second input signals to generate a first output signal representing a sum of the first and second input signals, and a second output signal representing a difference between the first and second input signals; and
a power recovery circuit coupled to one of the first and second output signals;
wherein:
   the combiner includes first, second, third, and fourth ports;
   the first and second ports are coupled to the first and second input signals, respectively;
   the third and fourth ports provide the first and second output signals respectively;
   the first output signal is generated from a portion of the first input signal and a portion of the second input signal, which portions have a first phase difference therebetween;
   the second output signal being generated from a portion of the first input signal and a portion of the second input signal, which portions have a second phase difference therebetween that is substantially equal to the first phase difference plus 180 degrees.

3. The apparatus of claim 2, further comprising:
a first impedance transformer coupled between the first and third ports;
a second impedance transformer coupled between the second and third ports;
a third impedance transformer coupled between the second and fourth ports; and
a fourth impedance transformer coupled between fourth and first ports.

4. The apparatus of claim 3, wherein:
the first, second, and fourth impedance transformers each have a phase shift of substantially 90 degrees; and
wherein the third impedance transformer has a phase shift of substantially 270 degrees.

5. An apparatus, comprising:
a power combiner responsive to first and second input signals to generate a first output signal representing a sum of the first and second input signals, and a second output signal representing a difference between the first and second input signals; and
a power recovery circuit coupled to one of the first and second output signals, wherein the power recovery circuit comprises a full wave rectifier circuit, the rectifier circuit having a single ended input port, and being coupled to one output signal of the combiner through a series capacitor.

6. The apparatus of claim 5, wherein:

the rectifier circuit comprises first and second diodes, each diode having an anode and a cathode, the diodes being connected in series so that the anode of the first diode is connected to the cathode of the second diode, the cathode of the first diode and the anode of the second diode being coupled through a charging capacitor; and wherein direct current power is provided across the cathode of the first diode and the anode of the second diode.

7. The apparatus of claim 6, wherein each diode is a schottky diode.

8. A method of efficient power amplification comprising the steps of:

combining two radio frequency input signals using sum and difference combining to generate an amplitude modulated signal and a power recovery signal; and storing energy derived from the power recovery signal for reuse as a power source.

9. The method of claim 8, wherein the two input signals have constant amplitude and a varying phase relationship with respect to each other.

10. A method of efficient power amplification comprising the steps of:

combining two radio frequency input signals to generate an amplitude modulated signal and a power recovery signal, wherein the two input signals have constant amplitude and a varying phase relationship with respect to each other, including the steps of:

providing a phase shift between the two input signals by a first amount, relative to each other, to generate the amplitude modulated signal; and providing a phase shift between the two input signals by the first amount, plus an additional phase shift of substantially 180 degrees relative to each other in order to generate the power recovery signal; and storing energy derived from the power recovery signal for reuse as a power source.

11. The method of claim 8, further comprising the step of rectifying the power recovery signal to provide direct current power.

12. A method of efficient power amplification comprising the steps of:

combining two radio frequency input signals to generate an amplitude modulated signal and a power recovery signal;

rectifying the power recovery signal to provide direct current power; and storing energy derived from the power recovery signal for reuse as a power source, including the step of storing the direct current power on a capacitor.

13. A method of recovering radio frequency energy in a transmitter, comprising the steps of:

generating first and second amplified radio frequency signals having a particular varying phase relationship, and having substantially constant amplitudes;

combining the first and second amplified radio frequency signals using a sum and difference combiner to generate an amplitude modulated radio frequency signal and a power recovery radio frequency signal; and converting the power recovery radio frequency signal into a direct current power signal.

14. The method of claim 13, further including the step of recharging an energy cell using the direct current power signal.

15. A communication device comprising:

a transmitter having a linear amplifier, the linear amplifier comprising substantially non-linear components, and a combiner having an input of two input signals having a constant amplitude and a varying phase relationship with respect to each other, and an output of an amplitude modulated signal derived from the two input signals; and a power recovery circuit coupled to the combiner of the linear amplifier to store unused energy from the transmitter.

16. The communication device of claim 15, wherein the non-linear circuits include at least two amplifiers operating in a non-linear class of operation.

* * * * *